United States Patent
Kwon et al.

(10) Patent No.: US 8,067,824 B2
(45) Date of Patent: *Nov. 29, 2011

(54) INTEGRATED CIRCUIT MODULE PACKAGE AND ASSEMBLY METHOD THEREOF

(75) Inventors: Youngwoo Kwon, Kyunggi-Do (KR); Ki Woong Chung, Seoul (KR)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 1689 days.

This patent is subject to a terminal disclaimer.

(21) Appl. No.: 10/932,409

(22) Filed: Sep. 1, 2004

(65) Prior Publication Data

US 2005/0212078 A1 Sep. 29, 2005

(30) Foreign Application Priority Data

Mar. 24, 2004 (KR) ........................ 10-2004-0020075

(51) Int. Cl.
*H01L 29/12* (2006.01)

(52) U.S. Cl. ......... 257/676; 257/E23.037; 257/E23.057; 257/E23.092; 257/E25.031

(58) Field of Classification Search .................. 257/666, 257/686, 676, 778, 777, 787, E23.004, E23.043, 257/E25.006, E25.013, E25.021, E25.027, 257/E21.614, 685, 723, 782, 730, 731, 733, 257/673, 516, 672, E23.037, E23.057, E23.092, 257/E25.031

See application file for complete search history.

(56) References Cited

U.S. PATENT DOCUMENTS

| | | | |
|---|---|---|---|
| 5,682,062 A | 10/1997 | Gaul | |
| 6,133,788 A | 10/2000 | Dent | |
| 6,198,168 B1 | 3/2001 | Geusic et al. | |
| 6,268,796 B1 | 7/2001 | Gnadinger et al. | |
| 6,306,975 B1 | 10/2001 | Zhao et al. | |
| 6,337,510 B1 * | 1/2002 | Chun-Jen et al. | 257/666 |
| 6,344,664 B1 * | 2/2002 | Trezza et al. | 257/82 |
| 6,353,265 B1 * | 3/2002 | Michii | 257/777 |
| 6,369,651 B1 | 4/2002 | Dent | |
| 6,376,909 B1 | 4/2002 | Forbes et al. | |
| 6,469,581 B1 | 10/2002 | Kobayashi | |
| 6,472,934 B1 | 10/2002 | Pehlke | |
| 6,492,667 B2 | 12/2002 | Kamiya | |
| 6,548,376 B2 | 4/2003 | Jiang | |
| 6,577,013 B1 | 6/2003 | Glenn et al. | |

(Continued)

OTHER PUBLICATIONS

U.S. Appl. No. 10/933,912, Youngwoo Kwon, Multilayer Integrated Circuit for RF Communication and Method for Assembly Thereof, filed Sep. 1, 2004.

*Primary Examiner* — A. Sefer
*Assistant Examiner* — Dilinh P Nguyen

(57) ABSTRACT

An integrated circuit module package includes a lead frame having a recessed area. A semiconductor die containing active electrical components is attached to the recessed area of the lead frame. An integrated passive device containing passive electrical components is vertically stacked with, and electrically coupled to, the semiconductor die. An optional heat sink is attached to the integrated passive device. The integrated passive device is connected to the lead frame by conductors to electrically couple the integrated passive device and the semiconductor die to circuitry external to the integrated circuit module package. A cap is then attached to the heat sink or the integrated passive device to protect the semiconductor die and the integrated passive device. The integrated circuit module package dissipates heat from the semiconductor die through the lead frame, and dissipates heat from the integrated passive device through the cap and optional heat sink.

35 Claims, 8 Drawing Sheets

U.S. PATENT DOCUMENTS

| | | |
|---|---|---|
| 6,734,556 B2 * | 5/2004 | Shibata .......................... 257/737 |
| 6,756,681 B1 | 6/2004 | Hanawa |
| 6,790,761 B2 | 9/2004 | Sakata |
| 6,791,417 B2 | 9/2004 | Pengelly et al. |
| 6,809,421 B1 | 10/2004 | Hayasaka et al. |
| 6,853,245 B2 | 2/2005 | Kim et al. |
| 6,922,102 B2 | 7/2005 | Myer et al. |
| 6,931,259 B2 | 8/2005 | Simmons et al. |
| 6,933,597 B1 | 8/2005 | Poddar et al. |
| 7,042,283 B2 | 5/2006 | Suzuki et al. |
| 7,053,706 B2 | 5/2006 | Kwon et al. |
| 7,061,314 B2 | 6/2006 | Kwon et al. |
| 7,064,606 B2 | 6/2006 | Louis |
| 7,268,426 B2 | 9/2007 | Warner et al. |
| 2002/0079567 A1 | 6/2002 | Lo et al. |
| 2004/0029404 A1 * | 2/2004 | Lin ................................ 438/958 |
| 2004/0080810 A1 * | 4/2004 | Martin et al. .................. 359/333 |
| 2005/0173784 A1 | 8/2005 | Bai et al. |

* cited by examiner

INTEGRATED CIRCUIT MODULE PACKAGE AND ASSEMBLY METHOD THEREOF

CROSS-REFERENCE TO RELATED APPLICATION

This application claims priority under 35 U.S.C. §119 from Korean Patent Application No. 2004-0020075 by Youngwoo Kwon, filed Mar. 24, 2004 and entitled "RF Module Package and Assembly Method Thereof," the disclosure of which is incorporated herein by reference. This application is related to U.S. Pat. No. 7,132,747 entitled "MULTILAYER INTEGRATED CIRCUIT FOR RF COMMUNICATION AND METHOD FOR ASSEMBLY THEREOF" filed on even date herewith.

BACKGROUND

1. Field of the Invention

The present invention relates generally to integrated circuit module packages and assembly methods thereof, and more particularly to radio-frequency (RF) module packages and assembly methods thereof.

2. Description of the Background Art

Mobile phone manufacturers are under competitive pressure to develop smaller, less expensive mobile phones. Accordingly, mobile phone designers may focus on reducing the size and cost of RF module packages in mobile phones. An RF module in a conventional mobile phone includes electronic circuitry for receiving, processing, and transmitting RF signals. The electronic circuitry of the RF module includes both active and passive components. Examples of active components in an RF module include a voltage controlled oscillator, a low noise amplifier, a filter, a mixer, and an antenna. Examples of passive components in an RF module include resistors, capacitors, and inductors.

Typically the active components as well as some smaller passive components of an RF module are integrated into a radio-frequency integrated circuit (RFIC) in the RF module. Generally, larger passive devices are not integrated into the RFIC because the larger passive devices would occupy large areas of the RFIC. In a conventional RF module, for example, an inductor is typically configured in the shape of a spiral in which a coil is wound several times within a defined area on a planar surface of the RFIC. Because the spiral inductor has an inductance proportional to the length of the coil, the number of windings of the coil, and other physical dimensions and geometric properties associated with the coil layout, the spiral inductor may occupy a large area in the RFIC.

An RFIC typically includes one or more power amplifiers that generate a large amount of heat, which may change transistor parameters and affect RF signal processing operation. If the heat generated by the RFIC is not effectively dissipated, electrical components of the RFIC may become damaged and rendered non-operational. Therefore, heat dissipation capacity is an important characteristic of an RF module package in additional to the size and thickness of the RF module package.

FIG. 1 depicts a conventional RF module 100. The conventional RF module 100 includes multiple RFICs 105, 120, and 130 mounted on a lead frame 135. The RFICs 105, 120, and 130 are electrically connected via bonding wires 110 to lead frame inductors 115, 125, and 140 formed on a surface of the lead frame 135. The lead frame inductors 115, 125, and 140 are serpentine inductors composed of the same conductive material as that of the lead frame 135 and are configured to match the impedances of the RFICs 105, 120, and 130. In one type of conventional RF module, the lead frame inductors 115, 125, and 140 may be formed on a printed circuit board (not shown) separate from the lead frame 135. The space occupied by the lead frame inductors 115, 125, and 140 largely determines the size and configuration of the conventional RF module and limits the ability to dissipate heat from the RFICs 105, 120 and 130.

FIG. 2 illustrates a cross-sectional view of the RFIC 105 (FIG. 1) packaged in a conventional plastic ball grid array (PBGA) package 200. As illustrated in FIG. 2, the RFIC 105 is mounted on the lead frame 135, which is attached to a package substrate 210. The package substrate 210 includes vias 215 (e.g., vias 215a-c) that are formed by drilling holes through the package substrate 210. Additionally, solder balls 220 (e.g., solder balls 220a-b) are mounted and electrically coupled to portions of the lead frame 135 near the vias 215. An electrode pad (not shown) of the RFIC 105 is electrically connected to the lead frame inductor 115 via the bonding wire 110a. The via 215c is filled with a conductive filler material, such as a metal, to establish an electrical connection between the lead frame inductor 115 and the portion of the lead frame 135 electrically coupled to the solder ball 220a.

The PBGA package 200 includes a plastic cap 205 formed over the RFIC 105. Because the lead frame 135 conducts heat much more effectively than the plastic cap 205 and the package substrate 210, heat generated by the RFIC 105 is substantially dissipated in one direction through the lead frame 135 to the ambient air environment of the PBGA package 200. Because the PBGA 200 dissipates heat from the RFIC 105 in substantially one direction, the heat dissipation capacity of the PBGA 200 is limited.

FIG. 3 illustrates a cross sectional-view of the RFIC 105 (FIG. 1) packaged in a thermally enhanced ball grid array (TEBGA) package 300. As illustrated in FIG. 3, the RFIC 105 is mounted on the lead frame 135 (FIG. 1). The lead frame 135 is attached to a front surface 320 of a heat sink plate 310. Electrode pads (not shown) of the RFIC 105 are electrically connected to electrode terminals 340 of a multi-layer printed circuit board (PCB) 325 via bonding wires 110. The electrode terminals 340 are electrically connected to various solder balls 335 through various metal-filled vias 330 in the PCB 325. A heat transfer gel 305 is attached to a back surface 315 of the heat sink plate 310 to facilitate heat transfer from the heat sink plate 310 to the ambient air environment of the TEBGA 300 package. Because heat generated by the RFIC 105 is dissipated in substantially one direction through the lead frame 135, the heat sink plate 310, and heat transfer gel 305, to the ambient air environment of the TEBGA package 300, the heat dissipation capacity of the TEBGA package 300 is limited.

The manufacturing process steps of assembling the multilayer PCB 325 in the TEBGA package 300 are complex and may result in low product yield. Consequently, the manufacturing cost of a TEBGA package 300 may be higher than that of other types RF module packages. Moreover, the configuration of the multi-layer PCB 325 limits the ability to design a small, thin TEBGA package 300.

It light of the above, there exists a need for a small, thin, RF module package having a high heat dissipation capacity.

SUMMARY OF THE INVENTION

The present invention addresses the need for a small, thin, integrated circuit (IC) module package having a high heat dissipation capacity. In the present invention, a semiconductor die containing active electrical components is stacked and interconnected with an integrated passive device (IPD) containing passive electrical components. The semiconductor die is attached to a lead frame and the IPD is electrically coupled to the lead frame. An optional heat sink is attached to the IPD. The stacked arrangement and optional heat sink allow the IC module package to have a high heat dissipation capacity. In one embodiment, the semiconductor die is attached to a recessed area of the lead frame, which reduces the thickness of the IC module package.

In one embodiment, an integrated circuit module package for enclosing an integrated circuit module including a semiconductor die and an integrated passive device, the semiconductor die stacked with, and electrically coupled to the integrated passive device is disclosed. The integrated circuit module package comprises: a lead frame having a recessed area configured for receiving the semiconductor die, the lead frame having at least one coupling finger configured for establishing an electrical connection to the integrated passive device, wherein the semiconductor die comprises a first integrated circuit containing active electrical components disposed on a front surface of the semiconductor die, and the integrated passive device comprises a second integrated circuit comprising passive electrical components disposed on a front surface of the integrated passive device.

In a further embodiment, a radio frequency module, comprises: a semiconductor die including, on a front surface thereof, a first integrated circuit having a first contact pad; an integrated passive device including, on a front surface thereof, a second integrated circuit having a second contact pad, the integrated passive device attached to the semiconductor die with the front surface of the semiconductor die facing the front surface of the integrated passive device; and a conductor electrically coupled to the first contact pad and the second contact pad.

In another embodiment, a radio frequency module package, comprises: a lead frame; a semiconductor die having a back surface attached to the lead frame and a front surface including a first integrated circuit having a first contact pad; an integrated passive device having a front surface including a second integrated circuit having a second contact pad, the integrated passive device attached to the semiconductor die with the front surface of the integrated passive device facing the front surface of the semiconductor die; and a first conductor electrically coupled to the first contact pad and the second contact pad.

DETAILED DESCRIPTION OF THE EMBODIMENTS

In accordance with one embodiment of the present invention, an IC module package includes a semiconductor die containing active electrical components and an IPD containing passive components. The semiconductor die is attached to a lead frame, and the IPD is stacked with, and attached to, the semiconductor die. Additionally, the IPD is electrically coupled to the lead frame, which can include coupling fingers for electrically connecting the semiconductor die and the IPD to circuitry that is external to the IC module package. An optional heat sink is mounted to the IPD. A cap is then placed over both the IPD and the optional heat sink to form the integrated circuit module package. The stacked arrangement of the semiconductor die and the IPD allows the integrated circuit module to be small, and allows heat to be effectively dissipated from both the semiconductor die and the IPD. In one embodiment, the semiconductor die is attached to a recessed area of the lead frame, which reduced the thickness of the integrated circuit module package.

Figure 1:
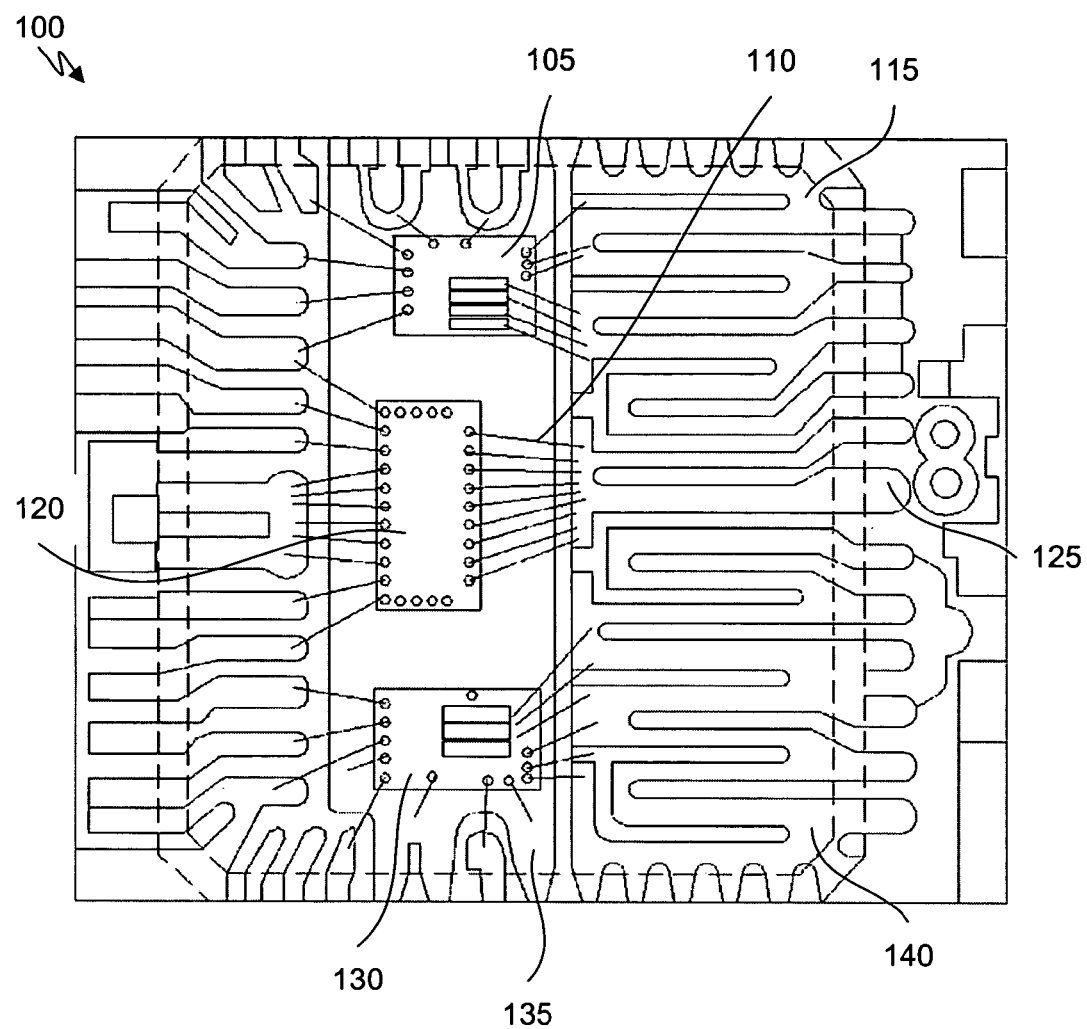
FIG. 1 is a top view of a conventional RF module package of the prior art.
Figure 2:
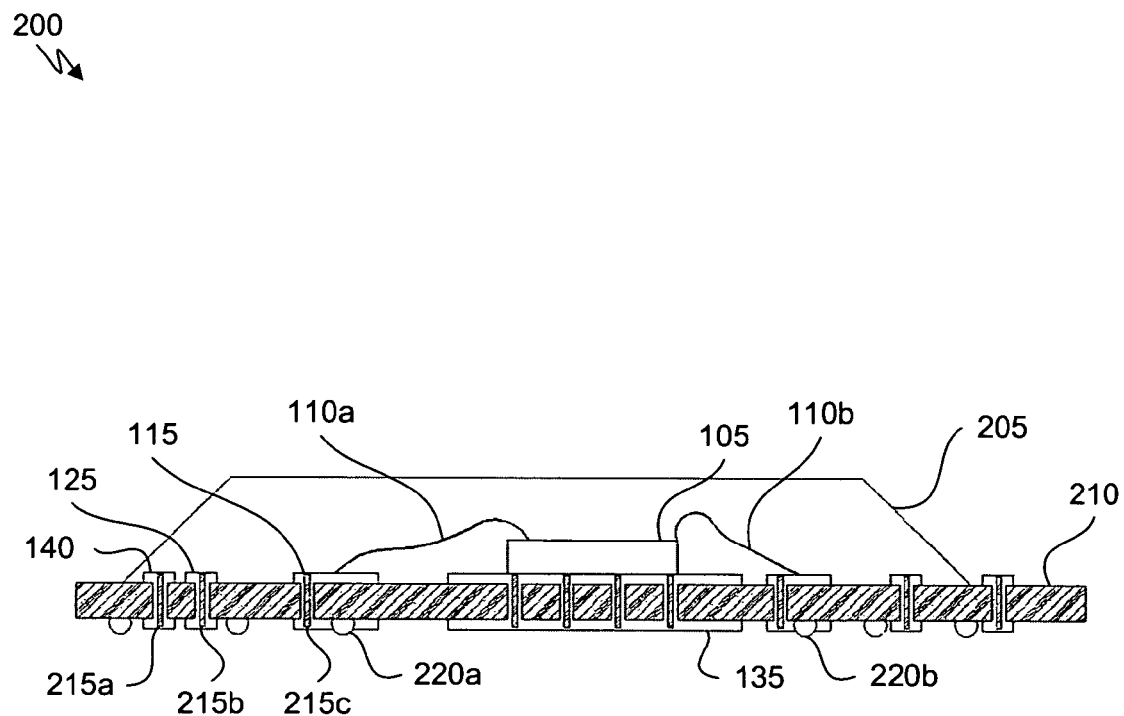
FIG. 2 is a cross-sectional view of a conventional plastic ball grid array package of the prior art.
Figure 3:
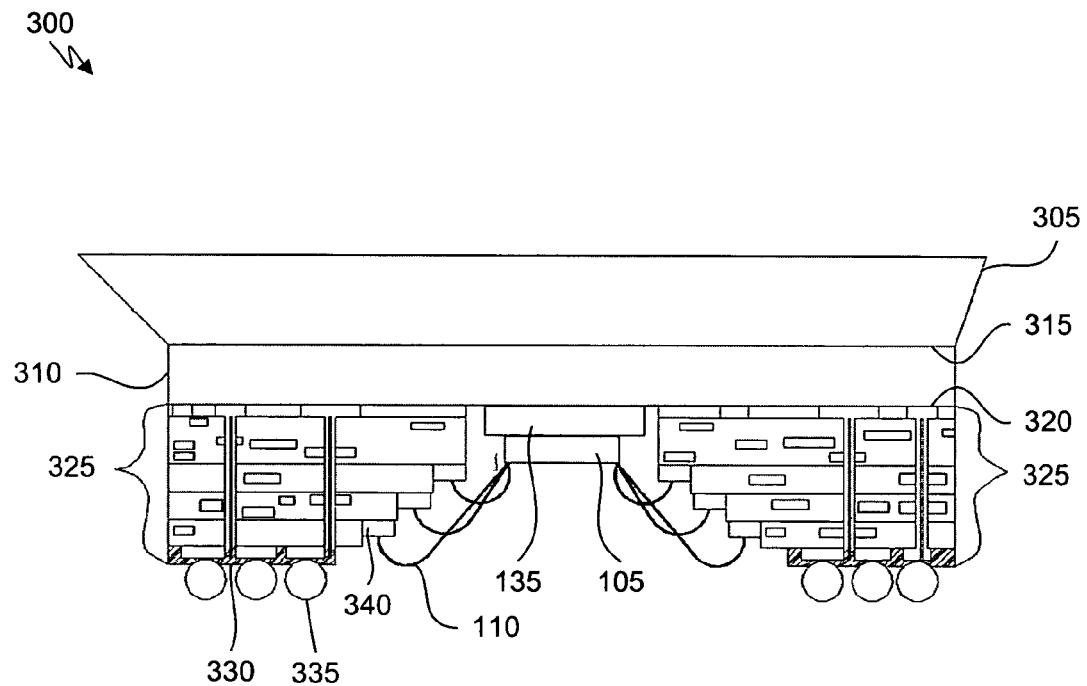
FIG. 3 is a cross-sectional view a conventional thermally enhanced ball grid array package of the prior art.
Figure 4:
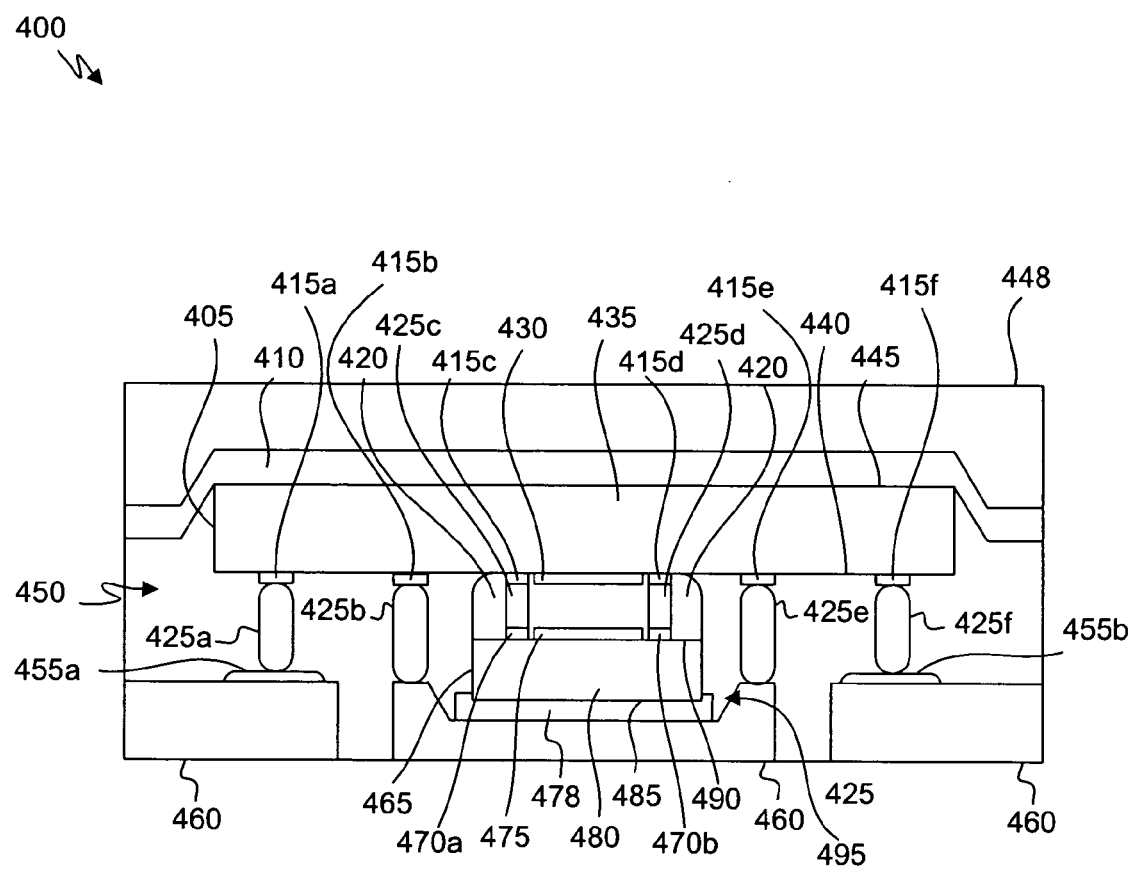
FIG. 4 is a cross-sectional view of an integrated circuit module package, in accordance with one embodiment of the present invention.

FIG. 4 illustrates a cross-sectional view of an integrated circuit (IC) module package 400, in accordance with one embodiment of the present invention. The IC module package 400 includes an RF module 450 attached to a lead frame 460. The RF module 450 includes an IPD 405 and a semiconductor die 465. The IPD 405 includes an integrated circuit 430 that contains passive electrical components. The semiconductor die 465 includes an integrated circuit 475 that includes active electrical components.

The lead frame 460 is composed of an electrically and thermally conductive material, such as metal. For example, the lead frame 460 can be composed of aluminum or an aluminum alloy. In one embodiment the lead frame 460 includes a recessed area 495, as is described more fully herein. Additionally, the lead frame 460 includes coupling fingers 455 (e.g., coupling fingers 455a and 455b) for electrically coupling the IC 475 of the semiconductor die 465 and the IC 430 of the IPD 405 to circuitry that is external to the IC module package 400. The coupling fingers 455 are also composed of a conductive material. In one embodiment, the lead frame 460 is etched to define the coupling fingers 455 and the recessed area 495. In a further embodiment, the recessed area 495 is near the center of the lead frame 460.

In one embodiment, the IC module package 400 is a leadless package, and the coupling fingers 455 serve as electrical contacts for circuitry that is external to the IC module package 400. In another embodiment, the IC module package 400 is a PBGA and the coupling fingers 455 function as electrical contacts for solder balls (not shown). Although the lead frame 460 is shown in FIG. 4 as having two coupling fingers 455a-b, it will be appreciated that the lead frame 460 can have any number of coupling fingers 455.

The semiconductor die 465 includes a substrate 480 that extends substantially between a front surface 490 and a back surface 485 of the semiconductor die 465. In one embodiment, the substrate 480 is composed of gallium arsenide (GaAs). The IC 475 is fabricated on the front surface 490 of the semiconductor die 465 and includes electrical components selectively interconnected to each other via conductive interconnects (not shown). The electrical components of the IC 475 include active components (e.g., transistors) and can also include passive components, (e.g., resistors, capacitors or inductors).

The IC 475 includes contact pads 470 (e.g., contact pads 470a and 470b) electrically coupled to the electrical components in the IC 475 via conductive interconnects (not shown). The contact pads 470 are composed of a conductive material. For example, the contacts pads 470 can be composed of aluminum, copper, gold, or alloys thereof.

The integrated passive device (IPD) 405 includes a substrate 435 that extends substantially between a front surface 440 and a back surface 445 of the IPD 405. In one embodiment, the substrate 435 is composed of silicon (Si). The IC 430 is fabricated on the front surface 440 of the IPD 405 and includes passive electrical components (e.g., resistors, inductors, and capacitors) selectively interconnected to each other via conductive interconnects (not shown). In one embodiment, the IPD 405 is a semiconductor die.

The IPD 405 includes contact pads 415 (e.g., contact pads 415a-f) electrically coupled to the passive electrical components in the IC 430 via conductive interconnects (not shown). The contact pads 415 are also composed of a conductive material. For example, the contacts pads 465 can also be composed of aluminum, copper, gold, or alloys thereof.

The recessed area 495 of the lead frame 460 is larger than the back surface 485 of the semiconductor die 465 and is configured to receive the semiconductor die 465. In one embodiment, the recessed area 495 is approximately the same size as the back surface 485 of the semiconductor die 465. In another embodiment, the recessed area 495 is at or near the center of the lead frame 460. In one embodiment, the back surface 485 of the semiconductor die 465 is attached to the recessed area 495 of the lead frame 460 via a conductive adhesive 478. For example, the conductive adhesive 478 can be a solder paste composed of copper (Cu) or silver (Ag), as would be appreciated by one skilled in the art. Because the lead frame 460 is composed of a thermally conductive material, the lead frame 460 can dissipate heat from the semiconductor die 465. Such heat is conducted through the conductive adhesive 478 and dissipated into the environment surrounding the IC package module 400.

In the embodiment of FIG. 4, the semiconductor die 465 is stacked with the IPD 405 such that the front surface 490 of the semiconductor die 465 faces the front surface 440 of the IPD 405. Additionally, the contact pads 470a-b of the semiconductor die 465 are electrically coupled to the respective contact pads 415c-d of the IPD 405 via respective conductors 425c-d located substantially between the front surfaces 490 and 440. For example, the conductors 425 can be stud bumps, solder bumps, or electroless bumps composed of a metal, such as gold (Au).

In one embodiment, the recessed area 495 of the lead frame 460 and portions of the lead frame 460 adjacent to the recessed area 495 are an electrical ground for the IC module package 400. In this embodiment, contact pads 415b and 415e of the IPD 405 are electrically coupled to portions of the lead frame 460 adjacent to the recessed area 495 via respective conductors 425b and 425e. Accordingly, the contact pads 415b and 415e are electrically grounded. Although FIG. 4 depicts two contact pads 415 (e.g., contact pads 415b and 415e) of the IPD 405 electrically coupled to the portion of the lead frame 460 adjacent to the recessed area 495, it will be appreciated that any number of contact pads 415 can be electrically coupled to the lead frame 460 adjacent to the recessed area 495.

In another embodiment, some of the contact pads 415 of the IPD 405 are electrically coupled to respective coupling fingers 455 via respective conductors 425. Although FIG. 4 depicts two contact pads 415 (e.g., contact pads 415a and 415f) of the IPD 405 electrically coupled to two coupling fingers 455 (e.g., coupling fingers 455a and 455b) via two conductors 425 (e.g., conductors 425b and 425e), it will be appreciated that the IC module package 400 can have any number of contact pads 415, coupling fingers 455, and conductors 425.

In one embodiment, the conductors 425 have high tensile strength, high ductility, and corrosion resistance. In some embodiments, the conductors 425 are formed by depositing a metal onto the contact pads 470. In some of these embodiments, heat, ultrasonic energy, and pressure are applied to the lead frame 460, the contact pads 470, and the contact pads 465 to form an electrical and mechanical connection between contact pads 470 and respective contact pads 465 via respective conductors 425.

A filler material 420 located around the conductors 425c-d and between the front surfaces 490 and 440 separates the front surface 490 of the semiconductor die 465 from the front surface 440 of the IPD 405. In one embodiment, the filler material 420 is an adhesive having a low elasticity that adheres to the front surfaces 490 and 440. In another embodiment, the filler material 420 is an epoxy material. In still another embodiment, the filler material 420 is a thermosetting material (e.g., a plastic material) that electrically insulates the front surfaces 490 and 440 from each other.

In one embodiment, the IC module package 400 includes a head sink 410 thermally coupled to the back surface 445 of the IPD 405. For example, the heat sink 410 can be a heat sink plate attached to the back surface 445. In another embodiment, the heat sink 410 is attached to an edge of the IPD 405. In various embodiments, the heat sink 410 can be composed of copper, a copper alloy, aluminum, steel, or an iron-nickel alloy, such as INVAR.

The heat sink 410 can dissipate heat generated by the semiconductor die 465 and the IPD 405 during operation of the RF module 450. Accordingly, heat generated by the RF module 450 is dissipated by the heat sink 410 in one direction and by the lead frame 460 in a substantially opposite direction. In this way, a high heat dissipation capacity is achieved by the IC module package 400.

In one embodiment, the IC module package 400 includes a cap 448 attached to the heat sink 410 or the IPD 405, or both. The cap 448 can be composed of an epoxy or plastic material that is molded over the heat sink 410 or the IPD 405. In another embodiment, the cap 448 is attached to portions of the lead frame 460. The cap protects the RF module 450 (e.g., the IPD 405 and the semiconductor die 465) inside the IC module package 400 from the environment of the IC module package 400 (e.g., prevents moisture from condensing on RF module 450).

Figure 5:
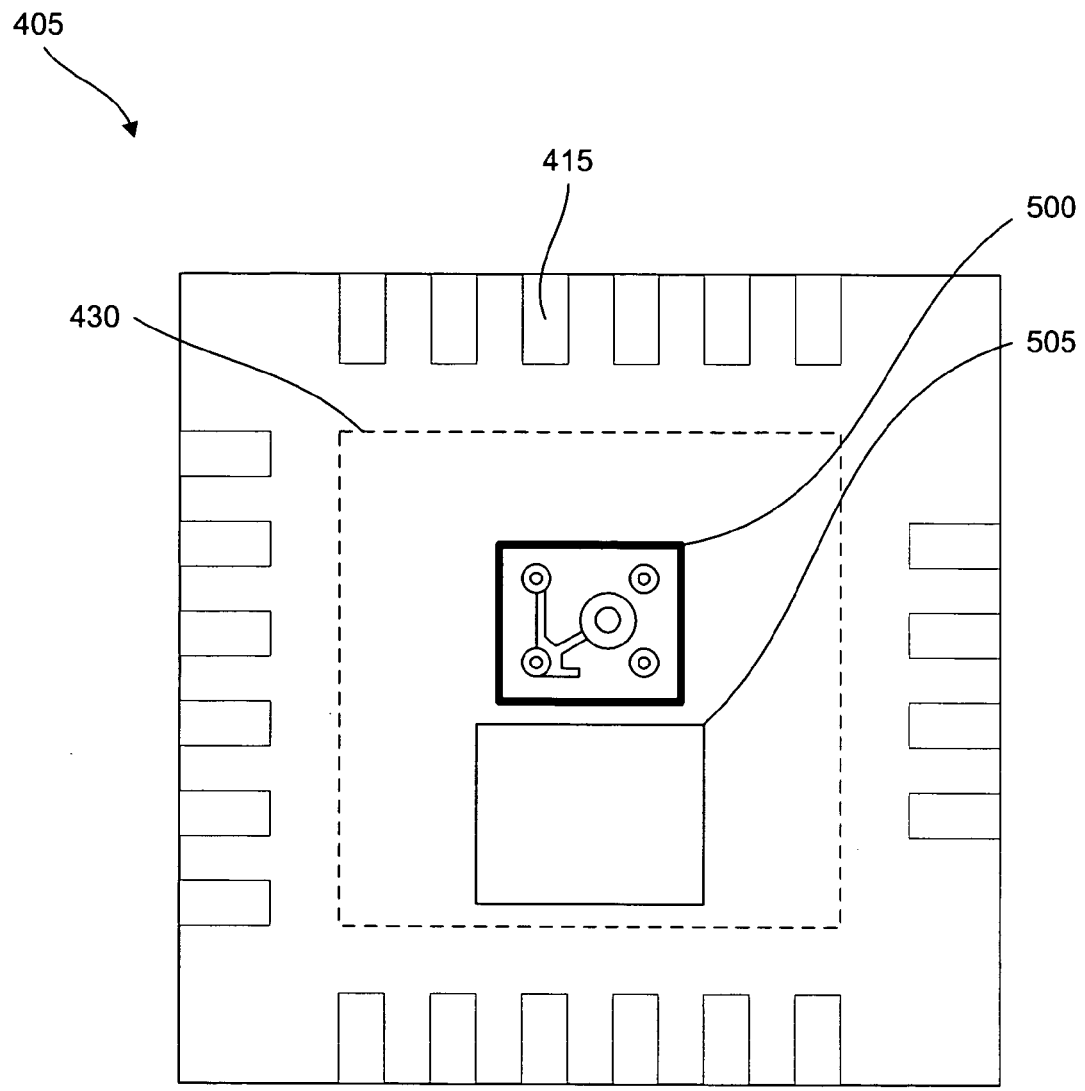
FIG. 5 is a bottom view of an integrated passive device, in accordance with one embodiment of the present invention.

FIG. 5 illustrates the IPD 405, in accordance with one embodiment of the present invention. In this embodiment, the IC 430 of the IPD 405 includes an IC 500 and an IC 505 that are electrically coupled to each other and to the contacts pads 415 of the IPD 405 via conductive interconnects (not shown). Although the contact pads 415 are arranged around the edges of the IPD 405, it will be appreciated that the contact pads 415 need not be located near the edges of the IPD 405. For example, some of the contact pads 415 can be located at the edges of the ICs 500 and 505.

In one embodiment, the IC 500 includes resistive and inductive electrical components (e.g., resistors and capacitors) and the IC 505 includes capacitive components (e.g., capacitors). For example, the resistors can be serpentine resistors formed of narrow serpentine shaped conductors, and the inductors can be spiral inductors formed of spiral shaped conductors or conductive wires. As a further example, the capacitors can be plane capacitors formed of metal layers separated by a dielectric layer, or interdigitated capacitors formed of a conductive polymer film including fingers separated by gaps.

In one embodiment, the larger passive electrical components (e.g., resistors, inductors, and capacitors) of the RF module 450 are located in the IPD 405. In this way, the areas of the back surface 485 and the front surface 490 of the semiconductor die 465 can be reduced. Moreover, by reducing the areas of the back surface 485 and the front surface 490, the size and cost of the semiconductor die 465 can also be reduced. For example, if the substrate 480 of the semiconductor die 465 is substantially composed of gallium arsenide and the substrate 435 of the IPD 405 is substantially composed of silicon, the cost of the IC module package 400 can be reduced because gallium arsenide is relatively expensive in comparison to silicon. Additionally, in this embodiment, larger passive components in the IPD 405 are isolated from the active components in the IC 475, which reduces electromagnetic noise in the RF module 450 and thus can improve the performance of the RF module 450.

Figure 6:
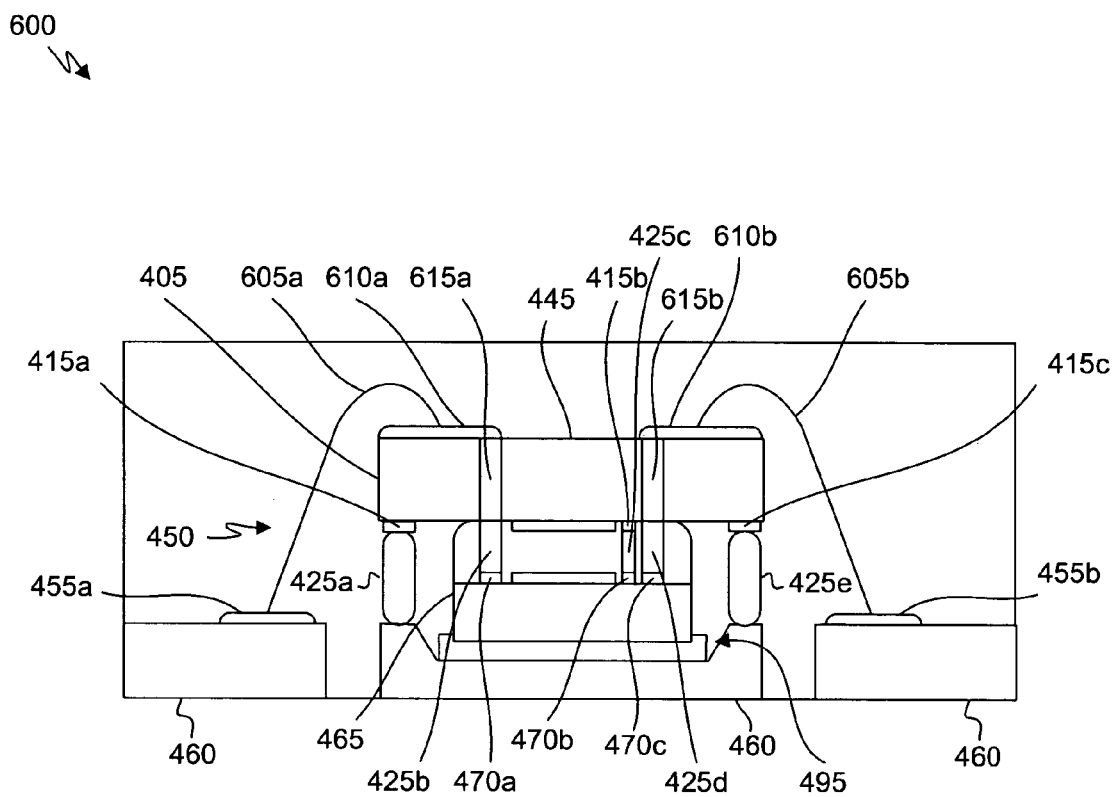
FIG. 6 is a cross-sectional view of an integrated circuit module package, in accordance with another embodiment of the present invention.

FIG. 6 illustrates an IC module package 600, in accordance with another embodiment of the present invention. The IC module package 600 of FIG. 6 is similar to the IC module package 400 of FIG. 4. The IC module package 600, however, has a different coupling structure between the IPD 405 and the coupling fingers 455. In the IC module package 600 of FIG. 6, the IPD 405 includes vias 615 (e.g., via 615a and 615b) that extend through the substrate 435 between the front surface 440 and the back surface 445 of the IPD 405. Additionally, the IPD 405 includes electrode pads 610 (e.g., electrode pads 610a and 610b) on the back surface 445 of the IPD 405, each of which is located near a via 615. In one embodiment, the via 615 is a substantially circular hole through the IPD 405 that is filled with a metal to electrically and mechanically couple the electrode pads 610 to some of the conductors 425. For example, the metal can be gold (Au), nickel (Ni), palladium (Pd), copper (Cu), or alloys thereof.

As shown in FIG. 6, the electrode pad 610a is coupled to the conductor 425b through the via 615a. As is also shown in FIG. 6, the electrode pad 610b is coupled to the conductor 425d through the via 610b. Although two electrode pads 610 (e.g., electrode pads 610a and 610b) are shown in FIG. 6, it will be appreciated that the IPD 405 can have any number of electrode pads 610 coupled to respective conductors 425.

In the IC module package 600, the electrode pads 610 are electrically coupled to the coupling fingers 455 via bonding wires 605 (e.g., bonding wires 605a and 605b). Although the IC module package 600 shown in FIG. 6 includes two electrode pads 610a and 610b electrically coupled to two respective coupling fingers 455a and 455b via two respective bonding wires 605a and 605b, it will be appreciated that the IC module package 600 can have any number of electrode pads 610, coupling fingers 455, and bonding wires 650.

In the IC module package 600 shown in FIG. 6, the contact pads 415a and 415c of the IPD 405 are electrically coupled to portions of the lead frame 460 adjacent to the recessed area 495 via respective conductors 425a and 425e. Additionally, the contact pad 415b of the IPD 405 is electrically coupled to the contact pad 470b of the semiconductor die 465 via the conductor 425c.

Figure 7:
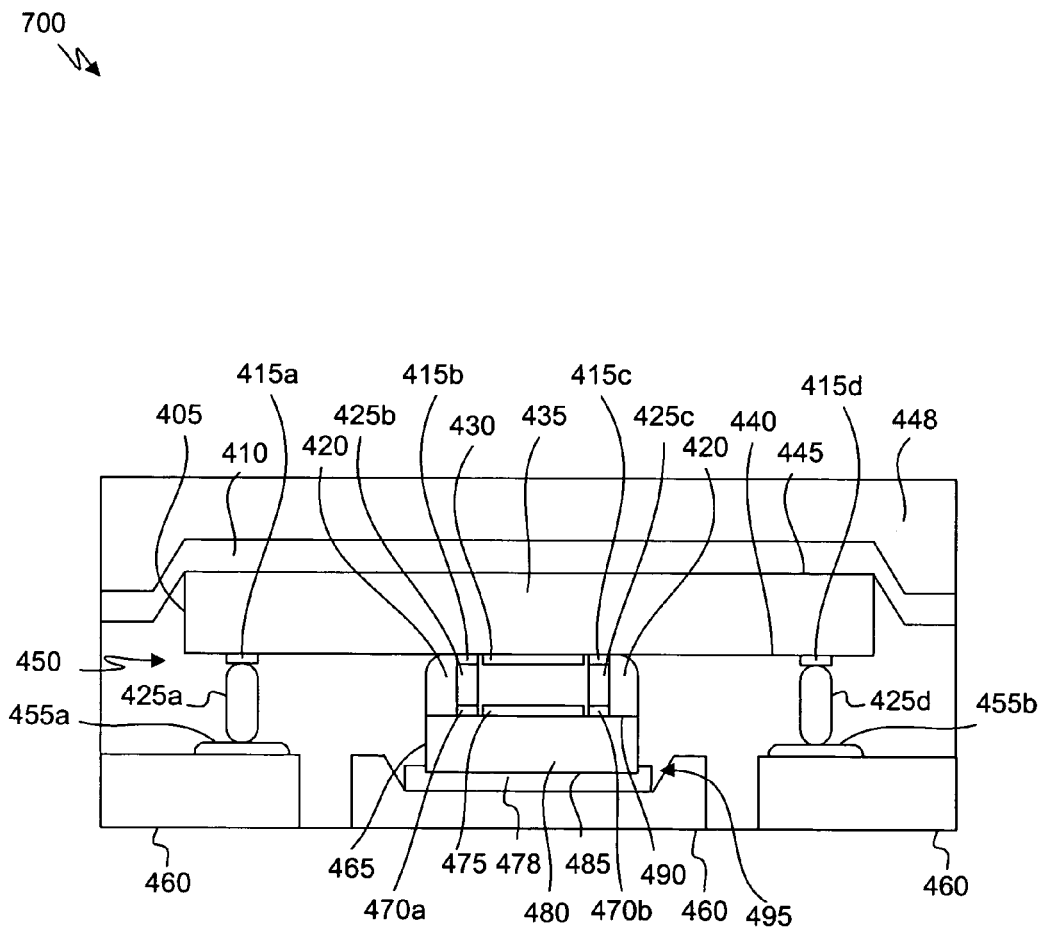
FIG. 7 is a cross-sectional view of an integrated circuit module package, in accordance with yet another embodiment of the present invention.

FIG. 7 illustrates an IC module package 700, in accordance with another embodiment of the present invention. The IC module package 700 of FIG. 7 is similar to the IC module package 400 of FIG. 4. In the IC module package 700, however, none of the contact pads 415 of the IPD 405 are electrically coupled to the portion of the lead frame 460 adjacent to the recessed area 495. As shown in FIG. 7, the contact pads 415a and 415d of the IPD 405 are electrically coupled to respective coupling fingers 455a and 455b via respective conductors 425a and 425d. Additionally, the contact pads 415b and 415c of the IPD 405 are electrically coupled to respective contact pads 470a and 470b of the semiconductor die 465 via respective conductors 425b and 425c.

Figure 8:
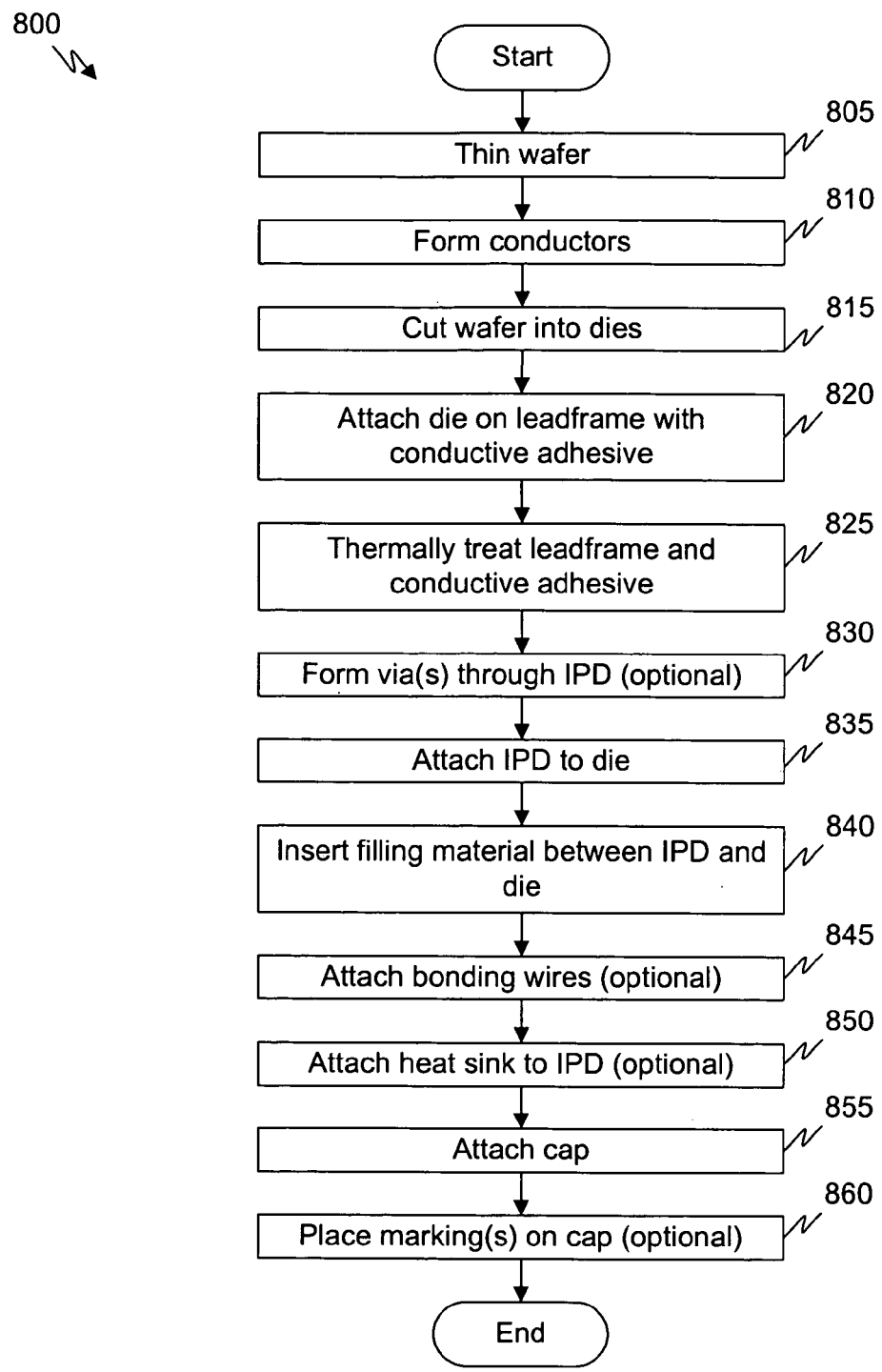
FIG. 8 is a flow chart of a method for assembling an integrated circuit module package, in accordance with one embodiment of the present invention.

FIG. 8 is a flowchart 800 of exemplary process steps for assembling the IC module package 400 shown in FIG. 4, in accordance with one embodiment of the present invention. In step 805, a semiconductor wafer having at least one integrated circuit 475 fabricated thereon is thinned. Thinning the semiconductor wafer can be accomplished by back-grinding the wafer, as would be appreciated by one skilled in the art. For example, a semiconductor wafer having a height of 500 microns can be thinned to a height of 100 microns. In one embodiment, the semiconductor wafer has a gallium arsenide substrate.

In step 810, the conductors 425 are formed on the contact pads 470 of the semiconductor die 465. As is discussed more fully herein, the conductors 425 can be stud bumps, solder bumps, or electroless bumps composed of a metal (e.g. gold). In one embodiment, the conductors 425 are formed by depositing the metal onto the contact pads 470 of the semiconductor die 465. In step 815, the semiconductor wafer is cut into semiconductor dies (e.g., semiconductor die 465), for example, by sawing.

In step 820, the back surface 485 of the semiconductor die 465 is attached to the lead frame 460 with a conductive adhesive 478. For example, the conductive adhesive 478 can be a solder paste. In step 825, the lead frame 460 and the conductive adhesive 478 are thermally treated (e.g., baked) to cure the conductive adhesive 478. Thermally treating the conductive adhesive 478 removes organic materials from the conductive adhesive 478.

In step 830, one or more vias 615 are formed through the IPD 405. In one embodiment, the vias 615 are formed by etching holes through the IPD 405. In this embodiment, the vias 615 are then filled with a conductive material (e.g. a metal) such that the conductive material contacts the electrode pads 610 on the back surface 445 of the IPD 405. Although step 830 is performed for various embodiments of the IC module package 600 described herein with respect to FIG. 6, step 830 need not be performed for all embodiments of the present invention.

In step 835, the IPD 405 is attached to the semiconductor die 465 with the front surface 440 of the IPD 405 facing the front surface 490 of the semiconductor die 465. In one embodiment, the IPD 405 is attached to the semiconductor die 465 by thermally treating the conductors 425. In this embodiment, the conductors 425 are solder bumps that are heated to a melting temperature and then allowed to cool to form a solder connection between the contact pads 415 of the IPD 405 and respective contact pads 470 of the semiconductor die 465. Further, in this embodiment, the solder bumps form both an electrical and mechanical connection between the contacts pads 415 of the IPD 405 and the contact pads 470 of the semiconductor die 465. In still a further embodiment, the IPD 405 includes metal filled vias 615 (e.g., formed in step 630). In this embodiment, the conductors 425 can also form an electrical and mechanical connection between the contact pads 470 of the semiconductor die 465 and the respective vias 615.

In step 840, the filler material 420 is inserted into any space existing between the IPD 405 and the semiconductor die 465.

In one embodiment, the filler material 420 is a low-dielectric contact epoxy material that is injected between the semiconductor die 465 and the IPD 405 from a syringe. The epoxy material electrically isolates the IPD 405 from the semiconductor die 465. Additionally, the epoxy material mechanically stabilizes the IPD 405 on the semiconductor die 465.

In step 845, one or more bonding wires 110 are selectively attached between the electrode pads 610 on the back surface 445 of the IPD 405 and the coupling fingers 455 of the lead frame 460. Although step 845 is performed for various embodiments of the IC module package 600 describe herein with respect to FIG. 6, step 845 need not be performed for all embodiments of the present invention.

In step 850, an optional heat sink 410 is attached to the back surface 445 of the IPD 405. The heat sink 410 functions to dissipate heat from the IPD 405 and the semiconductor die 465 in a direction from the IPD 405 toward the heat sink 410, as is described more fully herein. It will be appreciated that step 850 is optional in the present invention.

In step 855, a cap 448 is attached to the IPD 405 or the optional heat sink 410, or both. In one embodiment, an over-mold is placed over the IPD 405 and an epoxy material is deposited into the over-mold to contact the back surface 445 of the IPD 405 or the optional heat sink 410. The epoxy material is then cured to from the cap 448. In another embodiment, an over-mode is placed over the IPD 405 and a heated, malleable plastic is injected into the over-mold to contact the back surface 445 of the IPD 405 or the optional heat sink 410. In this embodiment, the plastic material is allowed to cool, and thus solidify, to form the cap 448. In some embodiments, the cap 448 is also attached to portions of the lead frame 460. In these embodiment, the cap 448 in combination with the lead frame 460 forms an enclosure for the semiconductor die 465 and the IPD 405. Additionally, the cap 448 protects the RF module 450 (e.g., the semiconductor die 465 and the IPD 405) from the environment surrounding the IC module package 400. In an optional step 860, markings are placed on the surface of the cap 448. For example, the markings can identify the RF module 450, a manufacturer, a part number, among other information.

The present invention has been described above with reference to exemplary embodiments. Other embodiments will be apparent to those skilled in the art in light of the disclosure. The present invention may readily be implemented using configurations other than those described above for the exemplary embodiments. Therefore, these and other variations upon the exemplary embodiments are covered by the present invention.

What is claimed is:

1. An integrated circuit module package for enclosing an integrated circuit module including a semiconductor die and an integrated passive device, the semiconductor die stacked with, and electrically coupled to the integrated passive device, the integrated circuit module package comprising:
a lead frame having a recessed area configured for receiving the semiconductor die, the lead frame having at least one coupling finger configured for establishing an electrical connection to the integrated passive device, wherein the semiconductor die comprises a first integrated circuit containing active electrical components disposed on a front surface of the semiconductor die, and the integrated passive device comprises a second integrated circuit comprising passive electrical components disposed on a front surface of the integrated passive device.

2. The integrated circuit module package of claim 1, wherein the lead frame further includes a conductive lead.

3. The integrated circuit module package of claim 1, wherein the integrated passive device is another semiconductor die.

4. The integrated circuit module package of claim 1, further comprising a cap attached to the lead frame, the cap in combination with the lead frame forming an enclosure for the semiconductor die and the integrated passive device.

5. The integrated circuit module package of claim 1, wherein the lead frame further comprises a conductive lead electrically coupled to the coupling finger.

6. The integrated circuit module package of claim 1, further comprising a cap attached to the lead frame, the cap in combination with the lead frame forming an enclosure for the semiconductor die and the integrated passive device.

7. The integrated circuit module package of claim 1, wherein the semiconductor die comprises a first integrated circuit containing active electrical components fabricated on a front surface of the semiconductor die, and the integrated passive device comprises a second integrated circuit containing passive electrical components fabricated on a front surface of the integrated passive device.

8. The integrated circuit module package of claim 7, wherein the front surface of the semiconductor device faces the front surface of the integrated passive device.

9. A radio frequency module, comprising:
a semiconductor die including, on a front surface thereof, a first integrated circuit having a first contact pad;
an integrated passive device including, on a front surface thereof, a second integrated circuit having a second contact pad, the integrated passive device attached to the semiconductor die with the front surface of the semiconductor die facing the front surface of the integrated passive device; and
a conductor electrically coupled to the first contact pad and the second contact pad.

10. The radio frequency module of claim 9, wherein the semiconductor die is composed of silicon.

11. The radio frequency module of claim 10, wherein the integrated passive device is another semiconductor die.

12. The radio frequency module package of claim 11, wherein the integrated passive device is composed of gallium arsenide.

13. The radio frequency module package of claim 9, wherein the conductor is a stud bump.

14. The radio frequency module package of claim 9, wherein the conductor is a solder bump.

15. The radio frequency module of claim 9, wherein the conductor is an electroless bump.

16. The radio frequency module of claim 9, wherein the first integrated circuit includes a third contact pad on the front surface of the semiconductor die and the second integrated circuit includes an electrode pad on the back surface of the integrated passive device, the integrated passive device further including a via containing a conductive material electrically coupled to the third contact pad and the electrode pad.

17. A radio frequency module package, comprising:
a lead frame;
a semiconductor die having a back surface attached to the lead frame and a front surface including a first integrated circuit having a first contact pad;
an integrated passive device having a front surface including a second integrated circuit having a second contact pad, the integrated passive device attached to the semiconductor die with the front surface of the integrated passive device facing the front surface of the semiconductor die; and a first conductor electrically coupled to the first contact pad and the second contact pad.

18. The radio frequency module package of claim 17, wherein the lead frame includes a recessed area, and the back surface of the semiconductor die is attached to the recessed area.

19. The radio frequency module package of claim 18, wherein the back surface of the semiconductor die is attached to the lead frame with a conductive adhesive.

20. The radio frequency module package of claim 19, wherein the conductive adhesive is a solder paste.

21. The radio frequency module package of claim 17, further comprising a filler material between the front surface of the semiconductor die and the front surface of the integrated passive device.

22. The radio frequency module package of claim 21, wherein the filler material is an electrically insulating material.

23. The radio frequency module package of claim 17, further comprising a cap covering the semiconductor die and the integrated passive device.

24. The radio frequency module package of claim 23, wherein the cap is a thermosetting material.

25. The radio frequency module package of claim 17, wherein the lead frame includes a coupling finger.

26. The radio frequency module package of claim 25, wherein the second integrated circuit includes a third contact pad on the front surface of the integrated passive device, the third contact pad electrically coupled to the coupling finger.

27. The radio frequency module package of claim 26, wherein the third contact pad is electrically coupled to the coupling finger with a second conductor.

28. The radio frequency module package of claim 27, wherein the third contact pad is electrically coupled to the coupling finger by a bonding wire.

29. The radio frequency module package of claim 27, wherein the second integrated circuit includes a fourth contact pad on the front surface of the integrated passive device, the fourth contact pad electrically coupled to the lead frame by a third conductor.

30. The radio frequency module package of claim 25, wherein the coupling finger is an external pin.

31. The radio frequency module package of claim 25, wherein the first integrated circuit includes a third contact pad on the front surface of the semiconductor die, and the integrated passive device includes an electrode pad on the back surface of the integrated passive device, the third contact pad electrically coupled to the electrode pad through a via extending between the front surface of the integrated passive device and the back surface of the integrated passive device.

32. The radio frequency module package of claim 31, further including a bonding wire electrically coupled to the electrode pad and the coupling finger.

33. The radio frequency module package of claim 17, wherein the integrated passive device is another semiconductor die.

34. The radio frequency module package of claim 33, wherein the semiconductor die is composed of silicon and the other semiconductor die is composed of gallium arsenide.

35. The radio frequency module package of claim 17, wherein the first conductor is a stud bump, a solder bump, or an electroless bump.

* * * * *